United States Patent [19]

Thomas et al.

[11] Patent Number: 4,477,512

[45] Date of Patent: Oct. 16, 1984

[54] FLEXIBILIZED FLAME RETARDANT B-STAGED EPOXY RESIN PREPREGS AND COMPOSITE LAMINATES MADE THEREFROM

[75] Inventors: Wilbur R. Thomas; Fred E. Hickman, III; George J. Knight, all of Hampton, S.C.

[73] Assignee: Westinghouse Electric Corp., Pittsburgh, Pa.

[21] Appl. No.: 490,061

[22] Filed: Apr. 29, 1983

[51] Int. Cl.³ .............................................. B32B 5/06
[52] U.S. Cl. .................................... 428/236; 428/248; 428/251; 428/285; 428/414; 428/415; 428/416; 428/417; 428/418; 428/537.1; 428/901
[58] Field of Search ............... 428/236, 251, 285, 415, 428/416, 417, 418, 901, 248, 414, 537

[56] References Cited

U.S. PATENT DOCUMENTS

| | | | |
|---|---|---|---|
| 3,378,434 | 4/1968 | Harrington | 161/184 |
| 3,393,117 | 7/1968 | Zolg | 161/81 |
| 3,499,821 | 3/1970 | Zinbarg | 161/185 |
| 3,617,613 | 11/1971 | Benzinger | 174/68.5 |
| 3,804,693 | 4/1974 | Nichols | 156/330 |
| 3,895,158 | 7/1975 | Gause | 428/220 |
| 4,043,954 | 8/1977 | Claybaker | 428/535 |
| 4,254,187 | 3/1981 | Claybaker | 428/498 |
| 4,311,753 | 1/1982 | Pucci | 428/251 |
| 4,327,143 | 4/1982 | Alvino | 428/236 |
| 4,343,731 | 8/1982 | Pucci | 523/427 |

OTHER PUBLICATIONS

Lee and Neville, Handbook of Epoxy Resins, 1967, Ch. 11-13 to 11-16.
Union Carbide, Flexol Plasticizer EPO, 1968, pp. 1-20.

Primary Examiner—Marion E. McCamish
Attorney, Agent, or Firm—D. P. Cillo

[57] ABSTRACT

A prepreg useful as the core in flame resistant cooper clad, composite, printed circuit boards is made by impregnating a porous substrate with an impregnant containing: either a brominated epoxy or epoxy resin and reactive flame retarding additive containing bromine and phenolic hydroxyl groups (e.g., tetrabromobisphenol A), phenolic novolac oligomer as curing agent, unsaturated epoxidized oil, and optionally, a suitable catalyst; and then heating the impregnated substrate to the "B"-stage.

18 Claims, 2 Drawing Figures

FLEXIBILIZED FLAME RETARDANT B-STAGED EPOXY RESIN PREPREGS AND COMPOSITE LAMINATES MADE THEREFROM

BACKGROUND OF THE INVENTION

Flame resistant, epoxy resin impregnated, all glass cloth laminates have been used in the printed circuit industry to make NEMA (National Electrical Manufacturers Association) FR-4 high grade copper clad circuit boards. These high grade circuit boards must have excellent electrical properties, superior dimensional stability and mechanical strength, and outstanding chemical resistance. Laminates of this type are taught by Alvino et al., in U.S. Pat. No. 4,327,143; Pucci et al., in U.S. Pat. No. 4,343,731; and Pucci, in U.S. Pat. No. 4,311,753, most using tetrabromobisphenol A as flame retarding agent and a form of dicyandiamide as curing agent.

While these FR-4 grade laminates have excellent electrical and mechanical properties, they are expensive, and it is difficult to cold punch holes through them. These all woven, glass cloth laminates are typically drilled to provide through holes. Thus, the search continues for inexpensive electrical grade laminates having improved fabricating properties, along with improved thermal aging characteristics, higher bond strength and heat distortion temperatures, i.e., Tg values, and even better blister resistance; and for "B"-staged prepregs, useful for manufacturing such laminates, having improved shelf life, and low levels of ionic contamination.

In the area of flame resistant paper based laminates for copper clad circuit board application, Nichols, in U.S. Pat. No. 3,804,693, attempted to improve room temperature shearing, blanking, punching, and other fabricating properties. There, a paper web is first impregnated with a water soluble phenolic resin mixed with a solvent, such as methyl alcohol. Then, the wetted paper web is impregnated with an epoxy modified phenolic resin comprising an admixture of: oil and/or rosin modified phenolic resin; water soluble phenolic resin; and bisphenol A epoxy resin; to which is added a brominated or chlorinated flame resistant additive, such as chlorinated bisphenyl or tris (2,3-dibromopropyl) phosphate, mixed with antimony oxide. The phenolic resins taught are of the resole type, where the mole ratio of (phenol):(formaldehyde) is from (1):(1 to 1.5).

Claybaker, in U.S. Pat. Nos. 4,043,954 and 4,254,187, makes flame resistant laminates from paper web sheets impregnated with an epoxy modified phenolic resin mixture containing: tung oil modified phenolic resole resin; epoxy resin prepared from a tetrabromobisphenol A; a flame retardant mixture of triphenyl phosphate and antimony trioxide; barium hydrate; low viscosity, catalyzed phenol-formaldehyde resin to facilitate paper penetration; and solvent.

Lee and Neville, in the *Handbook of Epoxy Resins*, McGraw-Hill, 1967, ch. 11-13 to 11-16, teach a wide variety of curing agents for epoxies, including resole phenol-formaldehyde resins; and also solid, high molecular weight phenolic novolac resins, for use with high melting point bisphenol A epoxy resins in solvent solution, when catalyzed with benzyldimethylamine.

Union Carbide Corporation, in a brochure titled *Flexol Plasticizer EPO*, 1968, describes epoxidized soybean oil as a plasticizer designed especially for use in polyvinyl chloride homopolymer and copolymer resins, and methyl methacrylate and polystyrene resins.

Harrington, in U.S. Pat. No. 3,378,434, utilized flexibilizing agents selected from polyesters, including propylene glycol-adipic acid resins in brominated epoxyepichlorohydrin bisphenol A resin impregnants utilizing halogenated anhydride curing agents, for use in fire resistant, paper based laminates.

Flame resistant, punchable, composite laminates, made from a resin impregnated cellulose paper core bonded to resin impregnated woven glass cloth surface layers, are taught by Gause et al., in U.S. Pat. No. 3,895,158. There, resins comprising bisphenol A or novolac epoxy, in combination with chlorinated phenol or brominated epoxy flame retardants, and curing agents such as dicyandiamide, are used in the glass cloth layer. Liquid lubricating oils are excluded. The cellulose paper core is impregnated with various resins including the same epoxy resin used in the surface layer but with an anhydride curing agent.

Flame resistant, punchable composite laminates, made from a resin impregnated nonwoven glass fiber core bonded to resin impregnated woven glass cloth surface layers are taught by Benzinger in U.S. Pat. No. 3,617,613 with epoxy resins and other thermosetting resins disclosed as binders. Similar structures are disclosed by Zinbarg in U.S. Pat. No. 3,499,821 and by Zolg et al. in U.S. Pat. No. 3,393,117.

Additionally, Marchetti et al., in copending application Ser. No. 490,098, filed on Apr. 29, 1983, assigned to the assignee of this invention, discloses a variety of laminates wherein the epoxy resin is cured with a phenolic novolic oligomer.

The improvements described in the prior art do not, however, solve a cold punching halo effect problem around through holes that has recently developed in the field. As the electronics art has moved toward greater miniaturization, the density of components mounted on printed circuit boards has increased. As a consequence of the increased density of components, there is also an increased density of punched through holes. There has also been a movement to a more mechanized or automated wave soldering process for rapidly soldering the component leads to the circuit board pattern. These developments have resulted in an undesirable, high re-work (hand soldering) rate after the wave soldering operation, with a number of previously acceptable commercially available punchable composite laminates, which we believe to be attributable to a need for improved punched hole quality. It is apparent that there is a need for new and improved cold punchable, flame resistant electrical grade composite copper clad printed circuit boards.

SUMMARY OF THE INVENTION

The above needs have been met and the above problems have been solved by providing a "B"-staged prepreg for the core sheets of composite laminates that may be used in combination with a variety of epoxy resin impregnated woven glass fiber surface sheets. This has been accomplished by employing a flexibilized modification of the flame retardant phenolic novolac cured epoxy resins disclosed by Marchetti et al in copending application Ser. No. 490,098, filed on Apr. 29, 1983. An epoxidized, naturally occurring, unsaturated fatty oil, preferably epoxidized soybean oil, is added to flexibilize that resin.

The flexibilized resin is impregnated into a porous cellulosic or glass paper substrate, and "B"-staged, i.e., heated to provide a dry but fusible prepreg. These "B"-staged prepregs can be stacked as a core in a press, with top and bottom epoxy resin impregnated woven glass cloth surface sheets, and cure laminated to make either NEMA CEM-1 or NEMA CEM-3 grade composite epoxy laminates, and the like. These composite laminates provide good electrical and mechanical performance and outstanding fabrication properties with improved punched hole quality and superior solderability. All of these laminates can have copper circuitry applied by well known additive or subtractive techniques.

BRIEF DESCRIPTION OF THE DRAWING

For a better understanding of the invention, reference may be made to the preferred embodiments exemplary of the invention, shown in the accompanying drawings in which.

DESCRIPTION OF THE PREFERRED EMBODIMENTS

Figure 1:
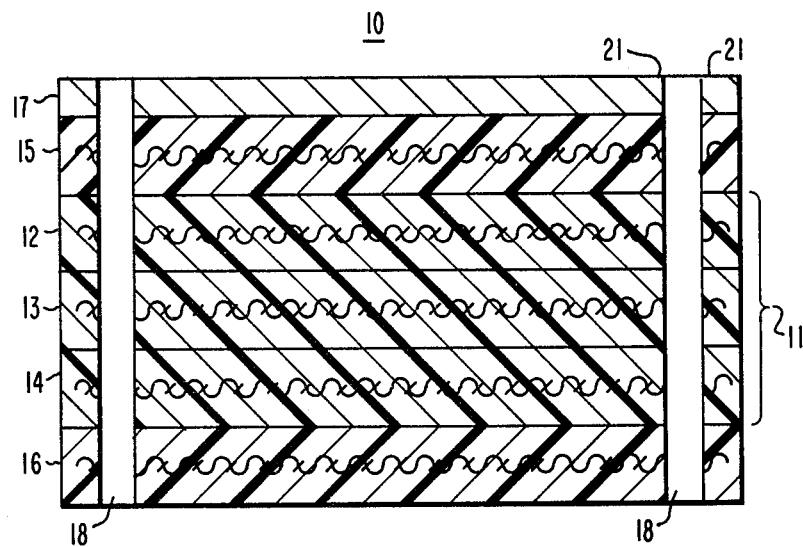
FIG. 1 is a cross-sectional view of one embodiment of a unitary, consolidated high pressure laminate in accordance with this invention, suitable as a printed circuit board.

In accordance with this invention the core impregnating resin is an admixture of the phenolic novolac cured brominated epoxy resin disclosed in application Ser. No. 490,098, filed on Apr. 29, 1983 (W.E. 51,035) and epoxidized oils. That brominated epoxy resin may be a prebrominated epoxy or a combination of a non-halogenated epoxy resin and, for example, tetrabromobisphenol A. These resins will make the laminates flame retardant and are suitable for electrical grade laminates.

Examples of readily commercially available pre-reacted brominated epoxy resins are the DER 511, DER 521 and DER 524 series offered by Dow Chemical Company. These prebrominated epoxy resins are (I) polyglycidyl ethers of bisphenol A and/or tetrabromobisphenol A. Also suitable is a resin made from (II) a mixture of (A) one or more non-halogenated epoxy resins, including polyglycidyl ethers of bisphenol A and (B) a flame retarding reactive additive, such as tetrabromobisphenol A. As will become apparent hereafter, tetrabromobisphenol A may be employed in combinations with a variety of non-halogenated epoxy resins, particularly mixtures that include cycloaliphatic epoxy.

Although tetrabromobisphenol A is preferred as (II)(B) above, other reactive flame retarding additives which contain bromine and phenolic hydroxyl groups may also be used. An example of an alternative brominated phenol is 1,3,5-tribromophenol. Tetrabromobisphenol A has 2 phenolic hydroxyl groups. The 1,3,5-tribromophenol has 1 phenolic hydroxyl group. The number of phenolic hydroxyl equivalents of these components, i.e. OH groups attached to an aromatic ring= weight/hydroxyl equivalent weight.

Useful (II)(A) non-halogenated epoxy resins include glycidyl polyethers, whose principal structure may be represented by the chemical formula:

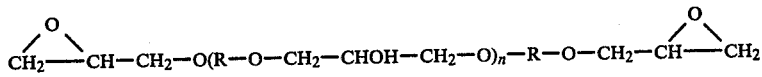

where n is an integer of the series 0, 1, 2, 3 ..., and R represents the divalent hydrocarbon radical of the dihydric phenol. Typically R is derived from bisphenol A or bisphenol F. These bisphenol type epoxy resins used in the invention have a 1,2 epoxy equivalency greater than one. They will generally be diepoxides. By the term "epoxy equivalent", is meant the number of 1,2 epoxy groups,

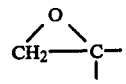

contained in the average molecule of the glycidylether. Typically, epoxy resins of bisphenol are readily available in commercial quantities and reference may be made to the Handbook of Epoxy Resins, by Lee and Neville, for a complete description of their synthesis.

Other (II)(A) non-halogenated epoxy resins that are particularly useful in this invention include polyglycidylethers of a novolac and cycloaliphatic epoxies. The polyglycidylethers of a novolac suitable for use in accordance with this invention are prepared by reacting an epihalohydrin with phenol formaldehyde condensates. The product of the reaction is generally a massive oxidation resistant aromatic compound. Although epoxy novolac resins from formaldehyde are generally preferred for use in this invention, epoxy novolac resins from any other aldehyde such as, for example, acetaldehyde, chloraldehyde, butylaldehyde, fufuraldehyde, can also be used. Although the above formula shows a completely epoxidized novolac, other epoxy novolacs which are only partially epoxidized can be useful in this invention. An example of a suitable epoxy novolac is 2,2,bis[p-(2,3-epoxypropoxy)phenyl]methane. These resins are well known in the art and reference may be made to the Handbook of Epoxy Resins for a complete description of their synthesis.

The cycloaliphatic type (II)(A) non-halogenated epoxy resins employed as the resin ingredient in the invention are selected from non-glycidyl ether epoxides containing more than one 1,2 epoxy group per molecule. These are generally prepared by epoxidizing unsaturated aromatic hydrocarbon compounds, such as cyclo-olefins, using hydrogen peroxide or peracids such as peracetic acid and perbenzoic acid. The organic peracids are generally prepared by reacting hydrogen peroxide with either carboxylic acids, acid chlorides or ketones to give the compound R-COOOH. These resins are well known in the art and reference may be made to Brydson, J., Plastic Materials, 1966, p. 471, for their synthesis and description.

Examples of these non-glycidyl ether cycloaliphatic epoxides would include 3,4-epoxycyclohexylmethyl-3,4-epoxy-cyclohexane carboxylate (containing two epoxide groups which are part of ring structures, and an ester linkage); vinyl cyclohexene dioxide (containing two epoxide groups, one of which is part of a ring structure); 3,4-epoxy-6-methylcyclohexyl methyl-3,4-epoxy- 6-methylcyclohexane carboxylate, and dicyclopentadiene, having the following respective structures:

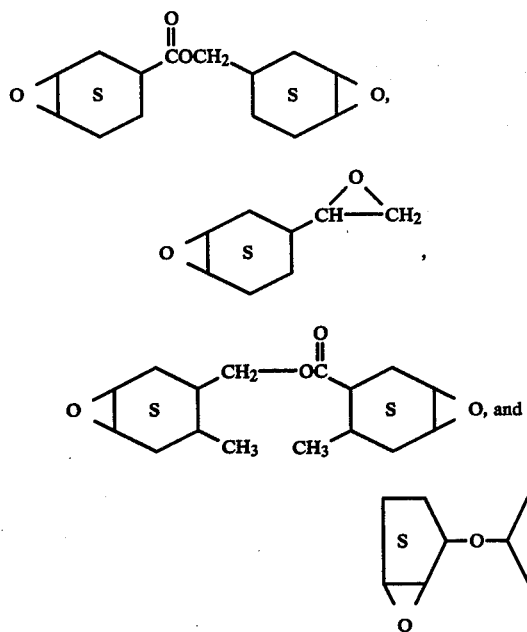

where S stands for a saturated ring structure.

Both of the (I) and (II)(A) epoxy resins can be characterized by reference to their epoxy equivalent weight, which is defined as the mean molecular weight of the particular resin divided by the mean number of epoxy groups per molecule. Thus, the number of epoxy equivalents=weight of the epoxy resin/epoxy equivalent weight. In the present invention, all of the suitable epoxy resins will have a preferred epoxy equivalent weight of from about 100 to about 1000.

Useful (III) epoxidized oils include epoxidized naturally ocurring unsaturated fatty oils, such as epoxidized corn, cottonseed, peanut, menhaden, linseed, tung, and preferably soybean, oils, and their mixtures. Suitable oils for epoxidation are made up largely of high molecular weight esters of carboxylic acids, all of which contain a large amount of unsaturation. Soybean oil, for example, contains about 7% to 11% of saturated $C_{16}$ fatty acid, 2% to 5% of saturated $C_{18}$ fatty acid, 22% to 34% of $C_{18}$ enoic unsaturated fatty acid, 50% to 60% of $C_{18}$ dienoic unsaturated fatty acid, and 2% to 10% of $C_{18}$ trienoic unsaturated fatty acid. They usually have a glycerol type structure and when epoxidized could be represented by the chemical structural formula:

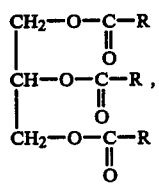

where R is

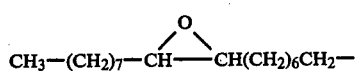

These oils are essential to the invention, and are used as "internal flexibilizers", herein defined as a long chain element introduced into the epoxy resin which reacts during cure. They are sometimes referred to as internal plasticizers. This is opposed to external flexibilizers which remain unreacted after cure, which are not useful in this invention, because at high temperature they can migrate to the surface and cause copper adhesion problems.

The structure and composition of the oils is well known, and reference can be made to Morrison and Boyd, *Organic Chemistry*, second edition, 1966, pp. 683 to 686, for further details. Epoxidation of these oils is a well known technique. Epoxidized soybean oil is produced through continuous peracetic acid epoxidation, which reults in low polyether content and low residual iodine number, along with a high oxirane oxygen (epoxy oxygen) content which is stable at high temperatures, as described in *Flexol Plasticizer EPO*, a brochure by Union Carbide Corporation, 1968.

With either the (I) or (II) epoxy resins, and the (III) epoxidized oils, certain (IV) phenolic novolacs are used as the curing agent. Phenolic novolacs are usually prepared by reacting phenol with formaldehyde in a molar ratio of (phenol):(formaldehyde) of about (1):(0.7 to 0.9) usually (1):(0.8) under acidic conditions. Under these conditions there is a slow reaction to form methylol phenols which then condense rapidly to form products of the dihydroxydiphenyl methane type, usually 2,4- and 4,4' dihydroxydiphenyl methane. These materials then slowly react with further formaldehyde to form their own methylol derivatives which in turn rapidly react with further phenol to produce higher molecular weight materials having the idealized chemical structural formula:

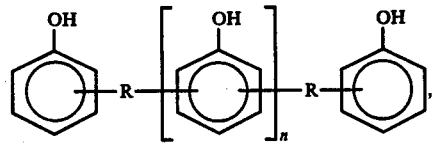

where R is usually $CH_2$, but can also be $C_2H_4$ and $C_3H_8$, when for example dichloroethane, and the like, is substituted for formaldehyde in the same molar ratio. Inclusion of alkyl groups over three carbons causes the Tg value as well as chemical and solvent resistance of the cured resin to drop significantly. Additionally, H on the aromatic rings can, in some instances, be substituted for by N or S. These novolacs themselves contain no reactive methylol groups, i.e., $-CH_2OH$, as do phenolic resoles. There can however be ether linkages, i.e., $-O-$, between novolac groups. The term "phenolic novolac" is here defined to include such N, S, $C_2H_4$ and $C_3H_8$ inclusions and ether linkages.

The phenolic novolacs useful as (IV) curing agents for the impregnating resins of this invention must have, on the average, over 2.5 phenolic hydroxyl groups, i.e., OH groups attached to an aromatic ring, preferably an average of from 2.5 to 15 phenolic hydroxyl groups per oligomeric unit, and most preferably, an average of from 4 to 8 phenolic hydroxyl groups per oligomeric unit. A most preferred phenolic novolac oligomer is represented by the chemical structural formula:

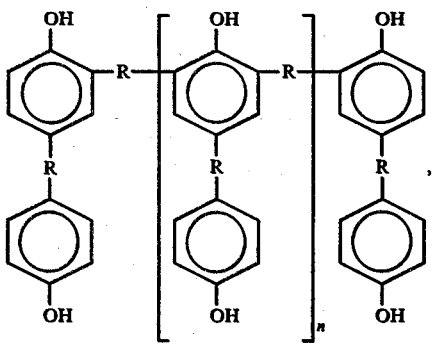

where each R group is selected from $CH_2$, $C_2H_4$, and $C_3H_8$, with $CH_2$ preferred, where the average of n=0 to 2, and isomers thereof.

The phenolic novolacs used herein should have a low free phenol content of less than about 1 weight percent free phenol. An average over 15 phenolic hydroxyl groups per phenolic novolac oligomeric unit, the epoxy resin system will have a tendency to gel rapidly during "B"-staging, so that prepreg shelf life will be reduced drastically. Over about 1 weight percent free phenol and Tg (glass transition) values may be reduced.

Phenolic resoles are not desirable curing agents, in this invention, because their methylol groups form water upon reacting. If the water is not absorbed by the substrate, it may cause voids in or delamination of the circuit board. Phenolic novolacs on the other hand provide no by-products upon reacting. Additionally, phenolic resoles are usually made with ionic catalysts, such as sodium carbonate or ammonium hydroxide, which could contaminate and deleteriously affect the electrical properties of the circuit board.

In the cured resins of this invention, the phenolic hydroxyls of the tetrabromobisphenol A, for example, and the phenolic novolac oligomer react with and cross link the 1,2 epoxy groups in the epoxy resin and the epoxidized oil, to provide a three dimensional structure. The use of phenolic novolac provides highly thermally stable, oxygen cross link junctions, resistant to chemical attack, rather than nitrogen cross link junctions resulting from use of dicyandiamide curing agents, which nitrogen junctions are subject to attack under high heat conditions—where the laminating resin contains from 10 weight percent to 20 weight percent bromine.

With the (II) resins, which employ (A) nonhalogenated epoxy resin, the phenolic hydroxyls in both the (B) brominated phenol, such as tetrabromobisphenol A, and in the (IV) phenolic novolac oligomer, should provide a combined total of phenolic hydroxyl equivalents that is less than or essentially equal to the combined total of epoxy equivalents in (II) and epoxidized oil (III). With the (I) prebrominated epoxy resin, the same ratio of phenolic hydroxyl equivalents (i.e., less than or essentially equal to the epoxy equivalents) should be maintained with respect to (I) and epoxidized oil (III), recognizing that if no unreacted tetrabrominated bisphenol A is present, the only source of phenolic hydroxyls may be the phenolic novolac curing agent (IV). In both cases, there will ideally be no unreacted phenolic hydroxyl groups, and preferably there will be an excess of unreacted epoxy groups. A substantial excess of phenolic hydroxyl groups results in degradation of the integrity of the cured resin. The ratio of total epoxy equivalents:total phenolic hydroxyl equivalents may, in this invention, be from above about 1:1 to about 1.6:1 and perhaps higher, although the higher ranges have not been evaluated experimentally. While the Tg of these laminates is not as high as those obtained in application Ser. No. 490,098, filed on Apr. 29, 1983 (W.E. 51,035), the mechanical and thermal properties do not appear to be adversely affected by the higher equivalent ratios.

Useful optional catalysts preferably include tertiary amines, such as, for example, triethanolamine, 2-dimethylamino-2-hydroxy propane, hexamethylenetetramine, pyridine, N,N-benzyldimethylamine, N,N-benzyldiethylamine, triethylamine, and the like; and imidazoles, such as, for example, imidazole, 1-methylimidazole, 2-methylimidazole, 2-ethyl-4 methylimidazole, and the like. These can be, and usually are, added in effective minor catalytic amounts. Use of these catalysts provides substantially higher Tg values for the cured resin, so their inclusion is preferred.

Useful solvents include oxygenated, not overly volatile solvents, such as, for example, methyl Cellosolve (ethylene glycol monomethyl ether), ethyl Cellosolve (ethylene glycol monoethyl ether), methyl ethyl ketone, methyl isobutyl ketone, dimethylformamide, and the like, and mixtures thereof. Acetone is relatively volatile, but may be used in admixture with xylene. As is well known, inorganic fillers can be added to fire resistant laminates. Examples of such fillers are listed in U.S. Pat. No. 4,371,579, and they may be used in the impregnating resin and, thus, in the prepregs and laminates of this invention, including particulate magnesium silicate, magnesium hydroxide, magnesium carbonate, calcium silicate, calcium carbonate, silica, aluminum trihydrate, mica, and their mixtures. Palladium compounds and other similar suitable fillers may also be used in resins for impregnating surface sheets where additive circuitry techniques are to be used, as is well known in the art.

Additives such as antimony trioxide, antimony pentoxide, and various phosphates, all well known in the art, may also be included, in minor amounts, to impart an additional degree of fire or flame resistance to the product. These materials can also substitute for the bromine containing flame retarding additive, and lower the bromine content of the cured resin to about 10% to 12%, without substantially harming the flame resistance of the final laiminate. Such lowered bromine content may be desirable in some applications.

Referring now to FIG. 1 of the drawings, unitary, consolidated, high pressure laminate NEMA CEM-1 grade circuit board 10 is shown. Core 11, contains three sheets, 12, 13 and 14, impregnated with the flexibilized resin of this invention, disposed between resin impregnated outer surface sheets 15 and 16. The core 11 can contain from one to eight or more sheets. The entire laminate thickness including a top metal foil 17 is from about 5 mil to about 250 mil.

Resin is impregnated into each of the sheets 12, 13, 14, 15 and 16, separately, usually by continuously passing porous cellulosic paper, for sheets 12, 13, and 14, and fibrous glass cloth, for sheets 15 and 16, from a reel, through a treater trough containing the appropriate epoxy resin impregnant, through rolls to remove excess resin, and then passing the impregnated sheet through a drying oven, to provide a "B"-staged prepreg, which is cut and stacked for storage. By "B"-staged is meant: the resin is heated in the sheet sufficiently to cause it to partially cure to a dry to the touch, non-tacky, fusible state, capable of further complete cure to the thermoset "C"-stage under heat and pressure. One obvious requirement of a "B"-staged prepreg is a long storage lifetime without undue moisture absorption or passage into the "C"-stage.

The cellulosic paper used for sheets 12, 13, and 14 can be made from water-laid wood cellulose fibers which have been treated or fibrillated to provide a high degree of bonding between the fibers in the sheet, providing strength, so that the paper can be treated without auxiliary support. Other cellulose fibers, such as cotton linter cellulose fibers, may also be water-laid to provide high strength sheets and may also be employed. The term "cellulosic paper" is meant to include such types of fibers. Unwoven glass fiber paper or mats may also be used.

The woven fibrous glass cloth used for sheets 15 and 16 is very strong. This glass cloth is available in a plain weave of continuous filaments, in a variety of styles and finishes, generally varying from about 1 to 7 mils (0.001" to 0.007") in thickness and from about 0.6 to 6 oz./sq. yd. in weight. Further details on the impregnating process and useful cellulosic paper and fibrous glass sheet material, can be found in U.S. Pat. No. 3,895,158.

One or more paper core sheets, along with woven glass fiber outer surface sheets of the "B"-staged prepreg can be stacked, with a metal foil outer sheet 17, preferably copper on top, and laminated for 1 to 1½ hours, at from 150° C. to 200° C. and from 500 psi. to 1500 psi, to "C"-stage the resin and bond all the component sheets together, providing circuit board 10. Copper foil, when used, is generally from about 0.7 mil to 2.8 mils thick, having a weight of from about ½ to 2 oz./sq. ft., respectively. In some instances, a metal foil can also be bonded to the bottom of layer 16.

This type of metal clad laminate is used when subtractive circuitry techniques are to be employed, where a resist or suitable mask is applied over the copper foil and undefined copper portions are etched away with suitable solutions, to leave the desired circuit configuration. This is the common manner of making circuit patterns.

In FIG. 1, the metal foil layer 17 is shown without a circuit pattern. Before or after etching, to provide the desired circuitry pattern, a number of through holes 18 may be drilled in or preferably cold punched through the laminate. These through holes may or may not be plated with copper and the like, by a combination of electroless and electroplating techniques, to provide electrical leads through the circuit board.

Figure 2:
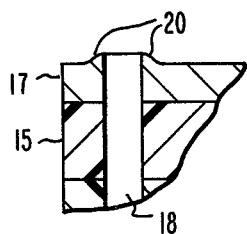
FIG. 2 is a cross-sectional, fragmented view of a halo effect, believed to be caused by core seizing during the punching operation.

Generally, cold punching is the most attractive method of making through holes, although it imposes a much greater fracture stress on the laminate, especially where there is an array of parallel through holes close to an edge of the circuit board. Cold punching can also provide a halo effect, shown in FIG. 2, where a ridge 20 is formed around the top circumference of the through hole 18, caused by core material seizing the perforator, as contrasted to flat surface 21 in FIG. 1, around the circumference of the through holes, resulting from use of the oil modified core resin impregnant of this invention. The halo effect causes poor wave soldering results, with required hand re-work soldering of unsoldered areas. Such seizing could also cause voids between layers and some delamination of the board. This soldering can also cause dimensional stability problems, if sophisticated resin systems are not used.

Referring again to FIG. 1, a wide variety of flame retardant epoxy resins can be used in the glass fabric outer surface sheets 15 and 16, for example, the mixture of bisphenol A epoxy or novolac epoxy, in combination with brominated epoxy flame retardants and curing agents such as dicyandiamide, as taught in U.S. Pat. No. 3,895,158. Preferably the resin used in the glass fabric outer surface sheets would be the same as the resin system disclosed in the aforementioned application Ser. No. 490,098, i.e., without the epoxidized oil of this invention, so that the glass fabric impregnant comprises: epoxy resin; flame retarding additive containing bromine, and phenolic hydroxyl groups; phenolic novolac oligomer as primary curing agent, having over 2.5 and preferably from 2.5 to 15 phenolic hydroxyl groups per oligomer; and optionally, a catalyst selected from the group consisting of tertiary amine, imidazole, and their mixtures; with optional fillers.

The following example illustrates but does not limit the invention.

EXAMPLE 1

A flame resistant, copper clad, NEMA CEM-1 grade composite laminate was made. First, the core impregnating resin of this invention was made. A mixing vessel was charged, at 25° C., with 25.4 parts by weight (25.4 weight percent) of methyl Cellosolve solvent, to which was added with good agitation until dissolved: 16.9 parts by weight (16.9 weight percent) of 100% solids tetrabromobisphenol A as flame retarding additive, having an average hydroxyl equivalent weight of about 271.9 (and containing 0.062 phenolic hydroxyl equivalents, i.e., 16.9/271.9); then 9.4 parts by weight (9.4 weight percent) of 100% solids phenolic novolac oligomer having an average hydroxyl equivalent weight of about 107 (and containing 0.087 phenolic hydroxyl equivalents, i.e., 9.4/107) and a melt viscosity at 150° C. of from 800 cps. to 1000 cps., sold commercially by Union Carbide Corporation under the trade name "Phenolic Novolac BRWE 5833", as primary curing agent.

To this solution was added: 34.3 parts by weight (34.3 weight percent) of a 97% solids solution in xylene of a catalyzed liquid diglycidyl ether of bisphenol A epoxy resin, having an epoxy equivalent weight of 193 and a viscosity of about 4,000 cps. at 25° C., (and containing 0.172 epoxy equivalents, i.e., [34.3/193]×0.97) sold commercially by Shell Chemical Company under the trade name "Epon 829"; 9.7 parts by weight (9.7 weight percent) of an epoxidized soybean oil having a molecular weight of about 1,000, a specific gravity at 20° C. of about 0.99 and an absolute viscosity at 20° C. of about 518 cps., having about 7.33% by weight as oxirane oxygen, and an epoxy equivalent weight of about 218 (and containing about 0.044 epoxy equivalents, i.e., 9.7/218) sold commercially by Union Carbide Corporation under the trade name "Flexol EPO", used as an internal flexibilizer; 0.2 parts by weight (0.2 weight percent) of benzyldimethylamine as a catalyst; and 4.0 parts by weight (4.0 weight percent) of antimony trioxide, for additional flame resistance. After final addition, the admixture was stirred for 30 minutes at 25° C., to provide an unreacted resinous solution having a viscosity of about 250 cps. at 25° C. In this resin admixture the combined total of phenolic hydroxyl equivalents was 0.149 and was less than the total epoxy equivalents of 0.216, i.e., the ratio of epoxy equivalents: phenolic hydroxyl equivalents was 1.45:1. The ratio of epoxy resin epoxy equivalents:epoxidized oil epoxy equivalents was 3.9:1.

Cotton linters cellulosic paper, having a thickness of 20 mil. (0.020") was first dipped in a low molecular weight, dilute phenolic-methanol-water solution to undercoat and expand the fibers of the paper, so that subsequent resin impregnant would adhere. This paper was then impregnated with the described resin admixture in a resin trough, passed between rollers to remove excess resin, and "B"-staged in a drying oven at about 160° C. for about 7 minutes, to provide a resin ratio of about 2.25, based on the weight of the undercoated paper, i.e., 1.25 parts by weight modified epoxy resin to 1 part by weight undercoated paper. This provided "B"-staged prepregs which had a shelf life of at least 15 days at 25° C.

The surface sheets were then made. Style 7628 glass fiber cloth, having a weight of 6.0 oz/sq. yd., was impregnated with a NEMA FR-4 type resin consisting of: 47.48 parts by weight (47.48 weight percent) of EPON 829 bisphenol A epoxy resin; 24.42 parts by weight (24.42 weight percent) of tetrabromobisphenol A; 1.79 parts by weight (1.79 weight percent) of dicyandiamide, as curing agent; 0.21 parts by weight (0.21 weight percent) of benzyldimethylamine as a catalyst; and 26.10 parts by weight (26.10 weight percent) of methyl Cellosolve solvent, to provide a glass fabric impregnating solution having a viscosity of about 120 cps. at 25° C. The impregnated glass fiber cloth was passed through rollers and "B"-staged as described above.

Three sheets, above 50"×74", of the phenolic novolac-epoxy resin-epoxidized oil impregnated cellulosic paper prepreg were used as a core between one top and one bottom impregnated style 7628 woven glass cloth surface sheet. This NEMA CEM-1 grade stack-up was then molded to one top sheet of one ounce copper foil at 1000 psi. and 160° C. for about 35 minutes, to provide, after cooling, a 1/16 inch flame resistant, copper clad, heat and pressure consolidated composite laminate. A series of tests were then run on the laminate and the results are given below in Table 1:

TABLE 1

| Property | Condition | Results |
|---|---|---|
| Bond | ASTM Cond. A | 11.4 lb./in. |
| Bond | 260° C. solder float for 20 sec. | 10.8 lb./in. |
| Blister | 260° C. solder float | 150 sec. |
| Blister | 287° C. solder float | 42 sec. |
| *Glass Transition (Tg) | ASTM Cond. A | 68° C. |
| Vol. Resistivity | C-96/35/90 | $2.56 \times 10^8$ |
| Sur. Resistivity | C-96/35/90 | $2.69 \times 10^5$ |
| Water Absorption | D-24/23 | 0.125% |
| Dielectric Breakdown | D-48/50 | 50+ |
| Dielectric Constant | D-24/23 | 4.57 |
| Dissipation Factor | D-24/23 | 0.0325 |
| Flex. Strength, length | ASTM Cond. A | 47,175 |
| Flex. Strength, cross | ASTM Cond. A | 40,891 |
| Wave Soldering:Oil Based Core Impregnant | ** | 39.8% |
| Wave Soldering:Control | ** | 7.0% |

*Differential Scanning Calorimeter
**See test procedure below

These results indicate acceptable heat distortion temperatures, i.e., Tg values, excellent bond strength, good moisture resistance, good flexural strength and electrical properties, and good solder resistance. This copper clad laminate, after copper etching to provide circuit patterns, could be used as an outstanding, relatively inexpensive circuit board.

The wave soldering test, referred to in Table 1, is a measure of cold punchability without causing a halo effect around the circumference of the through holes, and so is a measure of the effectiveness of the epoxidized oil, as an internal flexibilizer, to eliminate core seizure of the perforator. In this test, the copper surface of the composite laminate was cleaned, rinsed, and fluxed; then a molten tin layer was roller applied onto the surface, using a Union Tool Company roll soldering machine (Model 18T), after which the layer was neutralized. The composite was then cold punched (50 ton press), utilizing a punch die made by Wand Tool Company, with 112 holes, about 1/32" in diameter in a predetermined pattern. The punched composite was then observed for halo effects and very few were seen. The punched composite was then degreased. An Electrovert Econopak 229 wave soldering machine was used to flux, preheat the composite and wave solder at a 6½ ft./min. conveyor speed, where the copper side of the composite was drawn across an air agitated molten solder bath, to attempt to fill all 112 holes across the through hole top area. Through field examination, a hole fill rate of 35% on this test corresponded to a rate of about 98%, on printed circuit boards with components on production wave soldering equipment, i.e., if it is possible to fill 35% of the large gaps without component leads being present, then there will be little problem with soldering when the leads are present. A minimum acceptable value on this test would be 20%.

As can be seen the 39.8% indicated outstanding soldering ability, since a control NEMA CEM-1 grade commercial composite laminate, not utilizing the epoxidized soybean oil in the epoxy impregnating resin used in the core provided only a 7.0% rate, and would require substantial re-work soldering. This test indicates that the epoxidized soybean oil is effective as an internal flexibilizer for the core resin, substantially decreasing halo effects which interfere with wave soldering effectiveness. By using these epoxidized soybean oil flexibilized epoxy resins in the core, cold punchability is dramatically improved and re-work time is reduced, thereby improving the overall reliability of the wave soldered assembly.

Additional copper clad NEMA CEM-1 grade composite boards having oil flexibilized cores were made, in a similar fashion to that described in this Example, except that the parts by weight=weight percent of Flexol EPO in the core impregnating resin was changed to 3.5 and 12.0 parts by weight from 9.7 parts by weight. This provided a combined total of epoxy equivalents:total phenolic hydroxyl equivalents of 0.188:0.149, or 1.27:1 and 0.227:0.149, or 1.52:1, respectively. The ratio of epoxy resin epoxy equivalents:epoxidized oil epoxy equivalents was 10.75:1 and 3.12:1, respectively. The % fill on the wave soldering test was about 38.5% for 12.0 parts of Flexol EPO and about 22% for 3.5 parts of Flexol EPO, both above the minimum acceptable 20% value. Both physical and electrical properties of these two composite boards remained good.

The amount of epoxidized naturally occurring unsaturated fatty oil in the impregnating compositions of this invention is most conveniently expressed on a resin solids weight basis, i.e., including only the amounts of epoxidized oil (III) present in the combination of (I) or (II) and (III) and (IV), and not including solvents, fillers and any catalyst that may be present. On that basis, a significant improved hole quality (22% on the wave soldering test) was obtained at 5.6 percent of epoxidized oil (III) based on the total weight of resin solids. Improved hole quality (38.5% on the wave soldering test) was also obtained with 16.9 percent of epoxidized oil (III) on the total weight solids of another composition, with no deterioration of mechanical or thermal properties being noted. From the tests conducted, it appears that advantageous results can be expected from about 5 percent of epoxidized oil (III). We would be cautious in employing more than about 20 percent by weight because of a concern about the physical properties.

Another way of describing the amount of epoxidized oil in the impregnating compositions is as a ratio of epoxy resin equivalents, i.e., equivalents in either (I) or (II)A, to the epoxidized oil epoxy equivalents, i.e., the epoxy equivalents in the epoxidized oil (III). On that basis the epoxy resin epoxy equivalents:epoxidized oil epoxy equivalents would range from about 2 to 12:1, with a preferred ratio of about 3 to 6:1.

It should be understood that the flexibilized resin of this invention may also be employed for the core of other composites which employ epoxy impregnated woven glass fiber cloth surface sheets, as for example, the unwoven glass fiber or glass paper core of NEMA CEM-3 laminates.

The use of prebrominated epoxy resins and other epoxies, such as epoxy novolacs, use of flame retarding co-additives such as antimony trioxide, use of other phenolic novolacs as sole curing agents within the ranges hereinbefore set forth, use of other epoxidized oils or other imidazoles or tertiary amine catalysts, or use of inorganic fillers such as particulate magnesium silicate, silica, aluminum trihydrate, or mica, will produce similar desirable results.

We claim:
1. A flexibilized, "B"-staged resin impregnated porous substrate, the impregnating resin comprising a mixture of:
    A. a brominated epoxy resin, or a mixture of a non-halogenated epoxy resin and a flame retarding reactive additive containing bromine and phenolic hydroxyl groups,
    B. an epoxidized oil, wherein the oil is naturally occurring unsaturated fatty oil, and
    C. phenolic novolac oligomer curing agent having an average of over 2.5 phenolic hydroxyl groups per oligomeric unit, where the porous substrate is selected from the group consisting of cellulosic paper and unwoven fibrous glass sheet.
2. The resin impregnated substrate of claim 1, where the combined total of phenolic hydroxyl equivalents is less than or essentially equal to the combined total of epoxy equivalents.
3. The resin impregnated substrate of claim 1, where the phenolic novolac oligomeric unit has an average of from 2.5 to 15 phenolic hydroxyl groups per oligomeric unit, and the ratio of epoxy equivalents:phenolic hydroxyl equivalents is from above 1:1 to about 1.6:1.
4. The resin impregnated substrate of claim 1, where the phenolic novolac oligomeric unit has an average of from 4 to 8 phenolic hydroxyl groups per oligomer and less than 1 weight percent free phenol.
5. The resin impregnated substrate of claim 1, where the phenolic novolac oligomer (IV) has the structural formula:

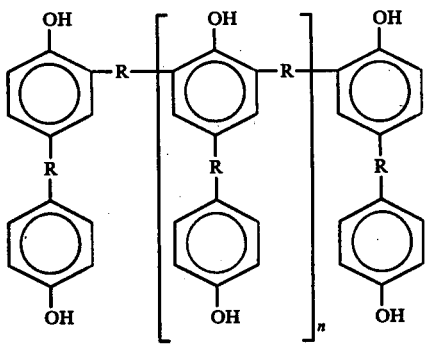

where the average of n=0 to 2, and each R is selected from $CH_2$, $C_2H_4$, and $C_3H_8$.

6. The resin impregnated substrate of claim 5, where the epoxy resin is a bisphenol A epoxy resin and the flame retarding additive is tetrabromobisphenol A.
7. The resin impregnated substrate of claim 6, where the epoxy resin is a mixture of bisphenol A epoxy and cycloaliphatic epoxy.
8. The resin impregnated substrate of claim 1 or claim 5, where the epoxidized oil constitutes at least about 5 percent, based on the total weight of resin solids of the impregnating resin, and functions as an internal flexibilizer during resin cure, said oil being selected from the group consisting of epoxidized corn oil, epoxidized cottonseed oil, epoxidized peanut oil, epoxidized menhaden oil, epoxidized linseed oil, epoxidized tung oil, epoxidized soybean oil, and mixtures thereof.
9. The resin impregnated substrate of claim 8, where the epoxidized oil is epoxidized soybean oil.
10. The resin impregnated substrate of claim 1 or claim 5, where the ratio of epoxy resin equivalents: epoxidized oil equivalents is from about 2 to 12:1.
11. A flexibilized, high pressure laminate comprising the bonded combination of:
    (1) outer surface layers of an epoxy impregnated woven glass fabric, and
    (2) a core layer comprising at least one resin impregnated porous sheet, the impregnating resin comprising a mixture of:
        A. a brominated epoxy resin, or a mixture of a non-halogenated epoxy resin and a flame retarding reactive additive containing bromine and phenolic hydroxyl groups,
        B. an epoxidized oil, wherein the oil is naturally occurring unsaturated fatty oil, and
        C. phenolic novolac oligomer curing agent having an average of over 2.5 phenolic hydroxyl groups per oligomeric unit, where the porous sheet is selected from the group consisting of cellulosic paper and unwoven fibrous glass sheet.
12. The laminate of claim 11, where an electrically conductive metal layer is bonded to at least one of said surfaces.
13. The laminate of claim 12, where the metal layer is copper.
14. The laminate of claim 11, where the porous sheet is cellulosic paper.
15. The laminate of claim 11, where the phenolic novolac oligomer (IV) has the structural formula:

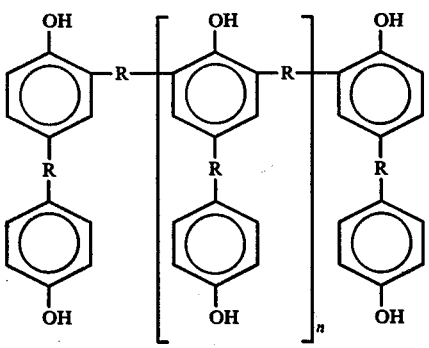

where the average of n=0 to 2, and each R is selected from $CH_2$, $C_2H_4$, and $C_3H_8$.

16. The laminate of claim 11, where the resin in the porous sheet was a mixture of (A) a non-halogenated epoxy resin and (B) tetrabrominated bisphenol A.

17. The laminate of claim 11, where the epoxidized oil is epoxidized soybean oil.

18. The laminate of claim 11, where the epoxidized oil constitutes at least about 5 percent, based on the total wieght of resin solids of the impregnating resin, the ratio of epoxy resin equivalents: epoxidized oil equivalents is from about 2 to 12:1, the epoxidized oil functions as an internal flexibilizer during resin cure, said oil being selected from the group consisting of epoxidized corn oil, epoxidized cottonseed oil, epoxidized peanut oil, epoxidized menhaden oil, epoxidized linseed oil, epoxidized tung oil, epoxidized soybean oil, and mixtures thereof.

* * * * *